United States Patent [19]
Lee

[11] Patent Number: 6,159,797
[45] Date of Patent: Dec. 12, 2000

[54] METHOD OF FABRICATING A FLASH MEMORY WITH A PLANARIZED TOPOGRAPHY

[75] Inventor: Tzung-Han Lee, Taipei, Taiwan

[73] Assignee: United Microelectronics Corp., Taiwan

[21] Appl. No.: 09/137,668

[22] Filed: Aug. 20, 1998

[30] Foreign Application Priority Data

Jun. 8, 1998 [TW] Taiwan ................................. 87109049

[51] Int. Cl.⁷ ................................................ H01L 21/336
[52] U.S. Cl. ........................ 438/257; 438/592; 257/315; 257/324
[58] Field of Search ................................... 257/315, 324, 257/326; 438/257, 592

[56] References Cited

U.S. PATENT DOCUMENTS

| | | | |
|---|---|---|---|
| 5,094,967 | 3/1992 | Shinada et al. | 438/257 |
| 5,474,947 | 12/1995 | Chang et al. | 438/257 |
| 5,566,106 | 10/1996 | Bergemont | 365/185 |
| 5,912,487 | 6/1999 | Hong | 257/315 |
| 5,981,365 | 11/1999 | Cheek et al. | 438/592 |
| 6,063,675 | 5/2000 | Rodder | 438/291 |

Primary Examiner—Olik Chaudhuri
Assistant Examiner—William David Coleman
Attorney, Agent, or Firm—Hickman Coleman & Hughes, LLP

[57] ABSTRACT

A method of fabricating a flash memory includes successive formation of a first polysilicon layer, a first dielectric layer and a hard material layer on a substrate with a tunnelling oxide layer. Then the hard material layer, the first dielectric layer and the first polysilicon layer are defined and the first polysilicon layer serves as a floating gate of the flash memory. After the step of definition, a source/drain region is formed on the substrate on the sides of the floating gate and an insulating spacer is also formed thereon. An inter-poly dielectric layer is then formed over the substrate and CMP is performed to etch back the inter-poly dielectric layer, exposing the surface of the hard material layer serving as a stop layer. Next, the hard material layer is removed and the first polysilicon layer is doped with impurities. A second dielectric layer is formed over the substrate and covers the surface of the first polysilicon layer. Subsequently, the second polysilicon layer is formed and defined to serve as a control gate of the flash memory.

28 Claims, 2 Drawing Sheets

METHOD OF FABRICATING A FLASH MEMORY WITH A PLANARIZED TOPOGRAPHY

CROSS-REFERENCE TO RELATED APPLICATION

This application claims priority benefit of Taiwan application Serial no. 87109049, filed Jun. 8, 1998, the full disclosure of which is incorporated herein by reference.

BACKGROUND OF THE INVENTION

1. Field of the Invention

The invention relates to a method of fabricating a flash memory, and more particularly to a method of fabricating a flash memory, which can increase layout design for circuit.

2. Description of the Related Art

Nonvolatile memory is currently applied to electronic devices to store structure data, program data and other data during repeated reading and writing episodes. The field of nonvolatile memory has recently focused on the electrically erasable programmable ROM (EEPROM) and EEPROM is broadly used for personal computer and electronic devices. Conventional EEPROM is accomplished by a floating gate transistor and has the advantages of writing, erasing and storing. However, EEPROM has the drawback of slow writing and reading speeds. The more recently developed flash memory EEPROM is already faster.

FIG. 1 is cross-sectional view of conventional flash memory, which mainly consists of a floating gate transistor. A tunneling oxide layer 102 is formed on a substrate 100 and a floating gate 104 is then formed thereon. Also, a control gate 108 is formed on the floating gate 104. A dielectric layer 106 is formed between the control gate 108 and the floating gate 104. N-type source/drain regions 110, 112 are formed on the sides of the floating gate 108 under the surface of the semiconductor substrate 100. An oxide spacer used to protect the floating gate transistor is formed on the sidewalls of the floating gate 104 and the control gate 108. As the data is stored, a high voltage of about 12V is added between drain region 110 and source region 112 while a high voltage is also applied on the control gate 108. Accordingly, hot electrons are discharged from the source region 112 and pass through the tunneling oxide layer 102 nearby the drain region 110. Finally, the hot electrons are injected and trapped in the floating gate 104 and they increase the threshold voltage of the floating gate transistor to achieve the object of data storage. On the other hand, as the data is erased, a proper negative voltage should be applied on the control gate 108 and the electrons trapped in the floating gate 108 can be passed through the tunneling oxide layer 105 and escape, resulting in erasing data. In this manner, the floating gate transistor can return to its pre-data storage state.

SUMMARY OF THE INVENTION

It is therefore an object of the invention to provide a method of fabricating a flash memory by adding a planarization process of chemical mechanical polishing to reduce the topography of the flash memory and the substrate. Therefore, a control gate can be easily formed and defined under the dimension of 0.25 µm in an integrated circuit.

Moreover, the floating gate is doped with impurities and the resistance in the floating gate can be controlled. Additionally, the dielectric formed thereon isn't damaged.

Additionally, the fabricating method of the flash memory in this invention increases the variance of the circuit layout and enhances the performance of the device.

To achieve these objects and advantages, and in accordance with the purpose of the invention, as embodied and broadly described herein, the invention is directed towards a method of fabricating a flash memory. A first polysilicon layer, a first dielectric layer and a hard material layer are successively formed on a substrate with a tunnelling oxide layer. Then the hard material layer, the first dielectric layer and the first polysilicon layer are defined and the first polysilicon layer serves as a floating gate of the flash memory. After the step of definition, a source/drain region is formed on the substrate on the sides of the floating gate and an insulating spacer is also formed thereon. An inter-poly dielectric layer is then formed over the substrate and CMP is performed to etch back the inter-poly dielectric layer to expose the surface of the hard material layer serving as a stop layer. Next, the hard material layer is removed and the first polysilicon layer is doped with the impurities. A second dielectric layer is then formed over the substrate and which covers the surface of the first polysilicon layer. Subsequently, the second polysilicon layer is formed and defined to serve as a control gate of the flash memory.

It is to be understood that both the foregoing general description and the following detailed description are exemplary and explanatory only and are not restrictive of the invention, as claimed.

DESCRIPTION OF THE PREFERRED EMBODIMENTS

Figure 1:
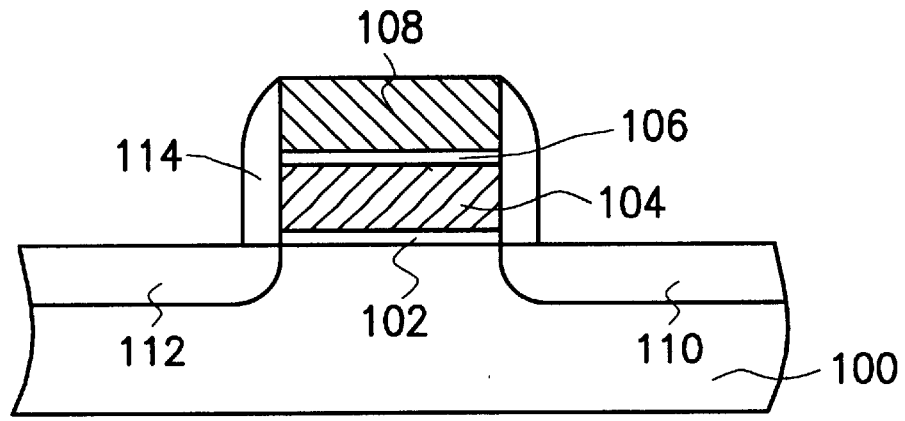
FIG. 1 is a cross sectional view of a conventional flash memory.
Figure 2A:
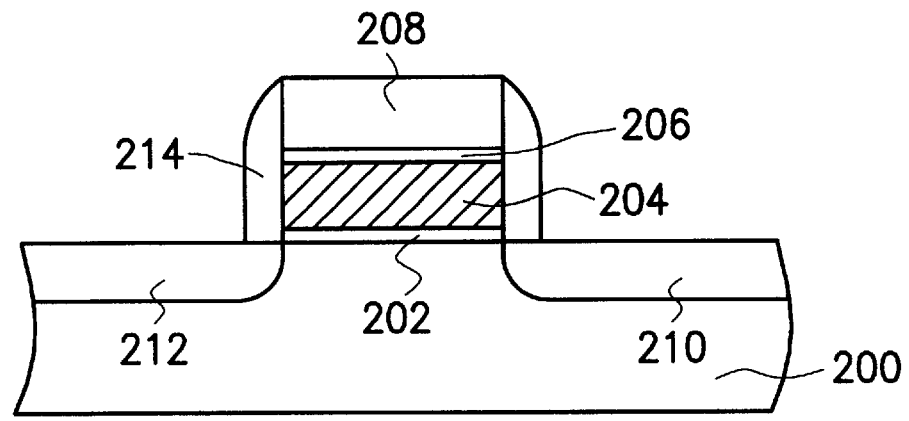
FIGS. 2A–2E are a cross-sectional view of fabricating a flash memory in a preferred embodiment according to the invention.

At first, a tunneling oxide layer 202 is formed on the substrate 200 by heating the substrate 200. A polysilicon layer 204, a dielectric layer 206 and a hard material layer 208 are formed successively on the tunneling oxide layer 202 and they are all defined as shown in FIG. 2A. The pattern of polysilicon layer 204 serves as a floating gate of the flash memory and is decided by the layout of a global circuit. Next, an ion implantation is performed on the substrate 200 and a source/drain region 210, 212 is therefore formed on the substrate 200 on the sides of the polysilicon layer 204. An insulating spacer 214 is then formed at the sidewalls of the defined hard material layer 208, dielectric layer 206 and polysilicon layer 202. The formation of the insulating spacer includes the step of forming an insulating layer over the substrate 200 and etching back the insulating layer to expose the surface of the hard material layer 208. The hard material layer 208 includes silicon nitride, silicon-oxy-nitride (SiON) or the like and the dielectric layer 206 can be replaced by a layer of amorphous Si.

Figure 2B:
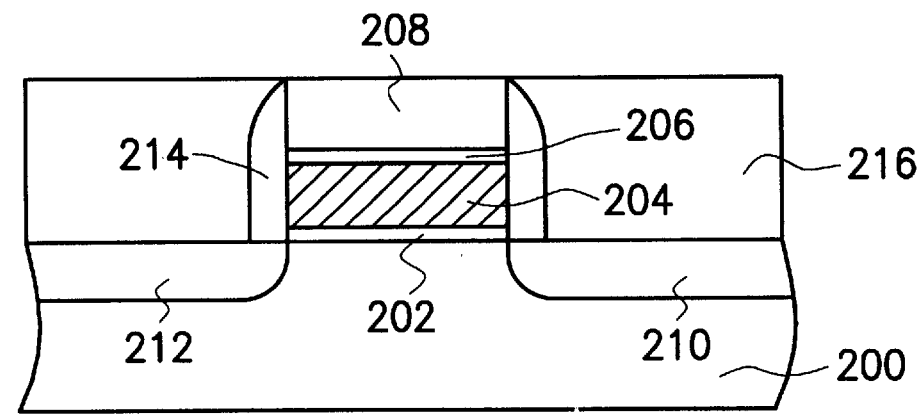

An inter-poly dielectric layer (IPD) 216 is deposited over the substrate 200 and includes silicon oxide. Then, using the hard material layer 208 as a stop layer, the inter-poly dielectric layer 216 is planarized by performing CMP to expose the hard material layer 208, as shown in FIG. 2B.

Figure 2C:
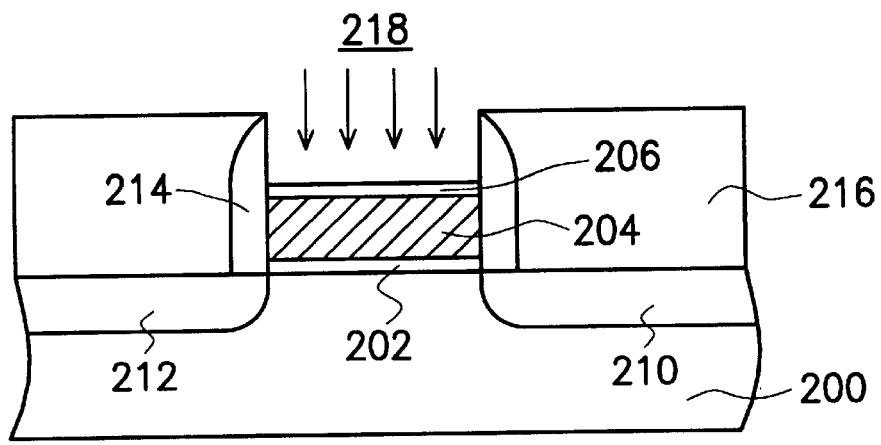

In FIG. 2C, the hard material layer 208 is removed by a method such as wet etching or plasma etching. In order to improve the conductivity of the polysilicon layer 204, an ion implantation is performed on the polysilicon layer 204. Because the ions 218 pass through the dielectric layer 206 or alternately through a layer of amorphous Si, the ions 218 can be spread into the polysilicon layer 204 both easily and uniformly due to the dielectric layer 206 or a layer of irregular, amorphous Si. Therefore, the resistance of the polysilicon layer 204 can be controlled. Otherwise, a thermal process can be performed on the substrate 200 to reduce the resistance of the polysilicon layer 204 and to repair the damage in the dielectric layer 206 induced by ion implantation.

Figure 2D:
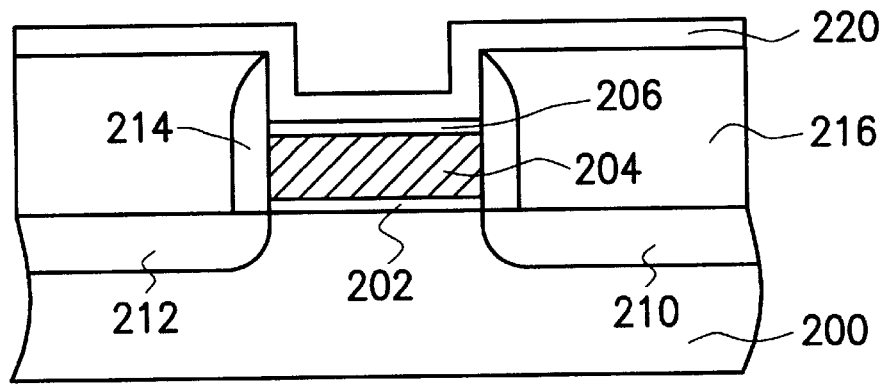
Figure 2E:
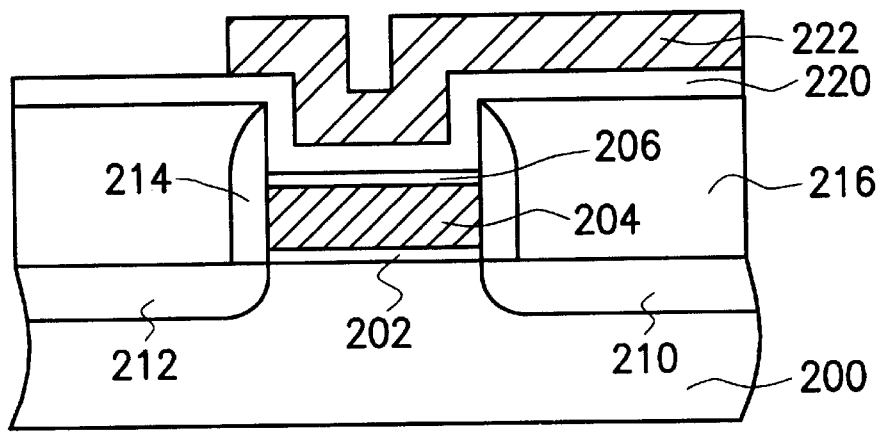

Referring to FIG. 2D, in order to prevent the hard material layer 208 and the dielectric layer 206 from being overetched and exposing the polysilicon layer 204, a dielectric layer 220 is then formed over the substrate 200 to protect the dielectric layer 206 from ion implantation which would result in current leakage. The dielectric layer 220 includes silicon oxide or silicon nitride. Subsequently, a polysilicon layer 222 is deposited on the dielectric layer 200 and defined by the circuit layout.

The pattern of the floating gate and the control gate in the preceding process is followed by circuit layout and is not limited by the pattern of flash memory in the prior art. In other words, to simplify the process, the dielectric layer 206 and the dielectric layer 220 can existed alternately. If the dielectric layer 206 and the dielectric layer 220 appear simultaneously in the flash memory, the quality of the flash memory is improved.

An inter-poly dielectric layer is provided and CMP is performed in this invention to reduce the topography of the substrate and the flash memory, so that the topography can be overcome in the formation and definition of polysilicon severing as a control gate. Therefore, the effect of reducing the topography is better for the development of flash memory in semiconductor industry, especially as the line width becomes narrower and narrower.

Moreover, the circuit layout in this invention can be varied by the process of flash memory to enhance the performance of devices.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a flash memory, the method comprising:

providing a substrate, wherein a tunneling oxide layer is formed on the substrate;

forming a first polysilicon layer and a hard material layer on the tunneling oxide layer;

patterning the hard material layer and the first polysilicon layer, such that the first polysilicon serves as a floating gate of the flash memory;

forming a source/drain region in the substrate beside sidewalls of the hard material layer and the polysilicon layer and forming an insulating spacer on the sidewalls;

forming an inter-poly dielectric layer on the substrate;

planarizing the inter-poly dielectric layer by chemical mechanical polishing to expose the hard material layer, wherein the hard material layer is a stop layer;

removing the hard material layer;

forming a dielectric layer over the substrate, wherein at least the first polysilicon layer is covered by the dielectric layer; and forming a second polysilicon layer on the dielectric layer and defining the second polysilicon layer to serve as a control gate of the flash memory.

2. The method according to claim 1, wherein the hard material layer includes a silicon nitride layer.

3. The method according to claim 1, wherein the hard material layer includes a silicon oxy-nitride layer.

4. The method according to claim 1, wherein the insulating spacer includes an oxide layer.

5. The method according to claim 1, wherein after the step of removing the hard material layer and before the step of forming the dielectric layer further, comprises performing a step of doping the first polysilicon layer.

6. The method according to claim 1, wherein the dielectric layer includes an oxide layer.

7. The method according to claim 1, wherein the dielectric layer includes a silicon nitride layer.

8. The method according to claim 1, wherein the inter-poly dielectric layer provides a planarized surface on the second polysilicon layer to perform deposition and patterning.

9. The method according to claim 1, wherein the method provides design of circuit layout.

10. A method of fabricating a flash memory, the method comprising:

providing a substrate, wherein a tunneling oxide layer is formed on the substrate;

forming a first polysilicon layer and a hard material layer on the tunneling layer;

patterning the hard material layer and the first polysilicon layer, wherein the first polysilicon serves as a floating gate of the flash memory;

forming a source/drain region in the substrate beside sidewalls of the hard material layer and the polysilicon layer and forming an insulating spacer on the sidewalls;

forming an inter-poly dielectric layer on the substrate;

performing chemical mechanical polishing to polish the inter-poly dielectric layer using the hard material layer as a stop layer;

removing the hard material layer; and forming a second polysilicon layer over the substrate, wherein the second polysilicon layer is defined to serve as a control gate of the flash memory.

11. The method according to claim 10, wherein the hard material layer includes a silicon nitride layer.

12. The method according to claim 10, wherein the hard material layer includes a silicon oxy-nitride layer.

13. The method according to claim 10, wherein the insulating spacer includes an oxide layer.

14. The method according to claim 10, wherein the inter-polysilicon dielectric layer provides a planarized surface on the second polysilicon layer with depositing and patterning.

15. The method according to claim 10, wherein the method provides design of circuit layout.

16. A method of fabricating a flash memory, the method comprising:

providing a substrate, wherein a tunneling oxide layer is formed on the substrate;

forming a first polysilicon layer, a first dielectric layer and a hard material layer on the tunneling oxide layer;

patterning the hard material layer, the first dielectric layer and the first polysilicon layer, wherein the first polysilicon layer serves as a floating gate of the flash memory;

forming a source/drain region in the substrate beside sidewalls of the hard material layer, the first dielectric layer and the first polysilicon layer and forming an insulating spacer on the sidewalls;

forming an inter-poly dielectric layer on the substrate;

planarizing the inter-poly dielectric layer by chemical mechanical polishing until the hard material layer is exposed;

removing the hard material layer to expose the first dielectric layer;

forming a second dielectric layer over the substrate such that at least the first polysilicon layer is covered by the first dielectric layer; and forming a second polysilicon layer on the second dielectric layer and defining the second polysilicon layer to serve as a control gate of the flash memory.

17. The method according to claim 16, wherein the hard material layer includes a silicon nitride layer.

18. The method according to claim 16, wherein the hard material layer includes a silicon oxy-nitride layer.

19. The method according to claim 16, wherein the insulating spacer includes an oxide layer.

20. The method according to claim 16, wherein after removing the hard material layer and before forming the second dielectric layer further comprises doping the first polysilicon layer through the first dielectric layer.

21. The method according to claim 16, wherein the second dielectric layer includes an oxide layer.

22. The method according to claim 16, wherein the second dielectric layer includes a silicon nitride layer.

23. The method according to claim 16, wherein the inter-poly dielectric layer provides a planarized surface on the second polysilicon layer with depositing and patterning.

24. The method according to claim 16, wherein the method provides design of circuit layout.

25. The method according to claim 10, wherein a dielectric layer is formed on the first polysilicon layer.

26. The method according to claim 25, wherein after removing the hard material layer and before forming the dielectric layer further comprises performing a step of doping the first polysilicon layer through the dielectric layer.

27. The method according to claim 10, wherein an amorphous Si is formed on the first polysilicon layer.

28. The method according to claim 27, wherein after removing the hard material layer and before forming the amorphous Si further, comprises performing a step of doping the first polysilicon layer through the amorphous Si.

* * * * *